United States Patent
Bakhishev et al.

(10) Patent No.: US 9,786,703 B2
(45) Date of Patent: Oct. 10, 2017

(54) BURIED CHANNEL DEEPLY DEPLETED CHANNEL TRANSISTOR

(71) Applicant: Mie Fujitsu Semiconductor Limited, Kuwana, Mie (JP)

(72) Inventors: Teymur Bakhishev, San Jose, CA (US); Lingquan Wang, Irvine, CA (US); Dalong Zhao, San Jose, CA (US); Pushkar Ranade, Los Gatos, CA (US); Scott E. Thompson, Gainesville, FL (US)

(73) Assignee: Mie Fujitsu Semiconductor Limited, Kuwana (JP)

( * ) Notice: Subject to any disclaimer, the term of this patent is extended or adjusted under 35 U.S.C. 154(b) by 0 days.

(21) Appl. No.: 15/285,308

(22) Filed: Oct. 4, 2016

(65) Prior Publication Data

US 2017/0025457 A1  Jan. 26, 2017

Related U.S. Application Data (62) Division of application No. 14/286,063, filed on May 23, 2014, now Pat. No. 9,478,571.

(60) Provisional application No. 61/827,070, filed on May 24, 2013.

(51) Int. Cl.
 *H01L 29/76* (2006.01)
 *H01L 29/94* (2006.01)
 (Continued)

(52) U.S. Cl.
 CPC .. *H01L 27/14616* (2013.01); *H01L 27/14689* (2013.01); *H01L 29/105* (2013.01);
 (Continued)

(58) Field of Classification Search
 CPC .......... H01L 29/1083; H01L 27/14689; H01L 29/105; H01L 27/14616; H01L 27/14643; H01L 29/7833; H01L 29/1087
 (Continued)

(56) References Cited

U.S. PATENT DOCUMENTS 3,958,266 A  5/1976  Athanas
4,000,504 A  12/1976  Berger
(Continued)

FOREIGN PATENT DOCUMENTS

EP  0274278  7/1988
EP  0312237  4/1989
(Continued)

OTHER PUBLICATIONS

Banerjee, et al. "Compensating Non-Optical Effects using Electrically-Driven Optical Proximity Correction", Proc. of SPIE vol. 7275 72750E (2009).
(Continued)

*Primary Examiner* — Thien F Tran
(74) *Attorney, Agent, or Firm* — Baker Botts L.L.P.

(57) ABSTRACT

Semiconductor devices and methods of fabricating such devices are provided. The devices include source and drain regions on one conductivity type separated by a channel length and a gate structure. The devices also include a channel region of the one conductivity type formed in the device region between the source and drain regions and a screening region of another conductivity type formed below the channel region and between the source and drain regions. In operation, the channel region forms, in response to a bias voltage at the gate structure, a surface depletion region below the gate structure, a buried depletion region at an interface of the channel region and the screening region, and a buried channel region between the surface depletion region and the buried depletion region, where the buried depletion region is substantially located in channel region.

7 Claims, 6 Drawing Sheets

(51) Int. Cl.
  *H01L 31/062* (2012.01)
  *H01L 31/113* (2006.01)
  *H01L 31/119* (2006.01)
  *H01L 27/146* (2006.01)
  *H01L 29/78* (2006.01)
  *H01L 29/10* (2006.01)
  *H04N 5/3745* (2011.01)

(52) U.S. Cl.
  CPC ...... *H01L 29/1083* (2013.01); *H01L 29/7833* (2013.01); *H01L 29/7838* (2013.01); *H04N 5/3745* (2013.01); *H01L 27/14643* (2013.01); *H01L 29/1087* (2013.01)

(58) Field of Classification Search
  USPC .................................. 257/403, E29.27, 402
  See application file for complete search history.

(56) References Cited

U.S. PATENT DOCUMENTS

| | | | |
|---|---|---|---|
| 4,021,835 | A | 5/1977 | Etoh |
| 4,242,691 | A | 12/1980 | Kotani |
| 4,276,095 | A | 6/1981 | Beilstein, Jr. |
| 4,315,781 | A | 2/1982 | Henderson |
| 4,518,926 | A | 5/1985 | Swanson |
| 4,559,091 | A | 12/1985 | Allen |
| 4,578,128 | A | 3/1986 | Mundt |
| 4,617,066 | A | 10/1986 | Vasudev |
| 4,662,061 | A | 5/1987 | Malhi |
| 4,761,384 | A | 8/1988 | Neppl |
| 4,780,748 | A | 10/1988 | Cunningham |
| 4,819,043 | A | 4/1989 | Yazawa |
| 4,885,477 | A | 12/1989 | Bird |
| 4,908,681 | A | 3/1990 | Nishida |
| 4,945,254 | A | 7/1990 | Robbins |
| 4,956,311 | A | 9/1990 | Liou |
| 5,034,337 | A | 7/1991 | Mosher |
| 5,144,378 | A | 9/1992 | Hikosaka |
| 5,156,989 | A | 10/1992 | Williams |
| 5,156,990 | A | 10/1992 | Mitchell |
| 5,166,765 | A | 11/1992 | Lee |
| 5,208,473 | A | 5/1993 | Komori |
| 5,270,558 | A * | 12/1993 | Reich ............... H01L 29/1091 257/223 |
| 5,294,821 | A | 3/1994 | Iwamatsu |
| 5,298,763 | A | 3/1994 | Shen |
| 5,369,288 | A | 11/1994 | Usuki |
| 5,369,295 | A * | 11/1994 | Vinal ............... H01L 21/26586 257/288 |
| 5,373,186 | A | 12/1994 | Schubert |
| 5,384,476 | A | 1/1995 | Nishizawa |
| 5,426,328 | A | 6/1995 | Yilmaz |
| 5,444,008 | A | 8/1995 | Han |
| 5,552,332 | A | 9/1996 | Tseng |
| 5,559,368 | A | 9/1996 | Hu |
| 5,608,253 | A | 3/1997 | Liu |
| 5,622,880 | A | 4/1997 | Burr |
| 5,624,863 | A | 4/1997 | Helm |
| 5,625,568 | A | 4/1997 | Edwards |
| 5,641,980 | A | 6/1997 | Yamaguchi |
| 5,663,583 | A | 9/1997 | Matloubian |
| 5,712,501 | A | 1/1998 | Davies |
| 5,719,422 | A | 2/1998 | Burr |
| 5,726,488 | A | 3/1998 | Watanabe |
| 5,726,562 | A | 3/1998 | Mizuno |
| 5,731,626 | A | 3/1998 | Eaglesham |
| 5,736,419 | A | 4/1998 | Naem |
| 5,753,555 | A | 5/1998 | Hada |
| 5,754,826 | A | 5/1998 | Gamal |
| 5,756,365 | A | 5/1998 | Kakumu |
| 5,763,921 | A | 6/1998 | Okumura |
| 5,780,899 | A | 7/1998 | Hu |
| 5,847,419 | A | 12/1998 | Imai |
| 5,856,003 | A | 1/1999 | Chiu |
| 5,861,334 | A | 1/1999 | Rho |
| 5,877,049 | A | 3/1999 | Liu |
| 5,885,876 | A | 3/1999 | Dennen |
| 5,889,315 | A | 3/1999 | Farrenkopf |
| 5,895,954 | A | 4/1999 | Yasumura |
| 5,899,714 | A | 5/1999 | Farremkopf |
| 5,918,129 | A | 6/1999 | Fulford, Jr. |
| 5,923,067 | A | 7/1999 | Voldman |
| 5,923,987 | A | 7/1999 | Burr |
| 5,936,868 | A | 8/1999 | Hall |
| 5,946,214 | A | 8/1999 | Heavlin |
| 5,985,705 | A | 11/1999 | Seliskar |
| 5,989,963 | A | 11/1999 | Luning |
| 6,001,695 | A | 12/1999 | Wu |
| 6,020,227 | A | 2/2000 | Bulucea |
| 6,043,139 | A | 3/2000 | Eaglesham |
| 6,060,345 | A | 5/2000 | Hause |
| 6,060,364 | A | 5/2000 | Maszara |
| 6,066,533 | A | 5/2000 | Yu |
| 6,072,217 | A | 6/2000 | Burr |
| 6,087,210 | A | 7/2000 | Sohn |
| 6,087,691 | A | 7/2000 | Hamamoto |
| 6,088,518 | A | 7/2000 | Hsu |
| 6,091,286 | A | 7/2000 | Blauschild |
| 6,096,611 | A | 8/2000 | Wu |
| 6,103,562 | A | 8/2000 | Son |
| 6,121,153 | A | 9/2000 | Kikkawa |
| 6,147,383 | A | 11/2000 | Kuroda |
| 6,153,920 | A | 11/2000 | Gossmann |
| 6,157,073 | A | 12/2000 | Lehongres |
| 6,175,582 | B1 | 1/2001 | Naito |
| 6,184,112 | B1 | 2/2001 | Maszara |
| 6,190,979 | B1 | 2/2001 | Radens |
| 6,194,259 | B1 | 2/2001 | Nayak |
| 6,198,157 | B1 | 3/2001 | Ishida |
| 6,218,892 | B1 | 4/2001 | Soumyanath |
| 6,218,895 | B1 | 4/2001 | De |
| 6,221,724 | B1 | 4/2001 | Yu |
| 6,229,188 | B1 | 5/2001 | Aoki |
| 6,232,164 | B1 | 5/2001 | Tsai |
| 6,235,597 | B1 | 5/2001 | Miles |
| 6,245,618 | B1 | 6/2001 | An |
| 6,268,640 | B1 | 7/2001 | Park |
| 6,271,070 | B2 | 8/2001 | Kotani |
| 6,271,551 | B1 | 8/2001 | Schmitz |
| 6,288,429 | B1 | 9/2001 | Iwata |
| 6,297,132 | B1 | 10/2001 | Zhang |
| 6,300,177 | B1 | 10/2001 | Sundaresan |
| 6,313,489 | B1 | 11/2001 | Letavic |
| 6,319,799 | B1 | 11/2001 | Ouyang |
| 6,320,222 | B1 | 11/2001 | Forbes |
| 6,323,525 | B1 | 11/2001 | Noguchi |
| 6,326,666 | B1 | 12/2001 | Bernstein |
| 6,335,233 | B1 | 1/2002 | Cho |
| 6,358,806 | B1 | 3/2002 | Puchner |
| 6,380,019 | B1 | 4/2002 | Yu |
| 6,391,752 | B1 | 5/2002 | Colinge |
| 6,426,260 | B1 | 7/2002 | Hshieh |
| 6,426,279 | B1 | 7/2002 | Huster |
| 6,432,754 | B1 | 8/2002 | Assaderaghi |
| 6,444,550 | B1 | 9/2002 | Hao |
| 6,444,551 | B1 | 9/2002 | Ku |
| 6,449,749 | B1 | 9/2002 | Stine |
| 6,461,920 | B1 | 10/2002 | Shirahata |
| 6,461,928 | B2 | 10/2002 | Rodder |
| 6,472,278 | B1 | 10/2002 | Marshall |
| 6,482,714 | B1 | 11/2002 | Hieda |
| 6,489,224 | B1 | 12/2002 | Burr |
| 6,492,232 | B1 | 12/2002 | Tang |
| 6,500,739 | B1 | 12/2002 | Wang |
| 6,503,801 | B1 | 1/2003 | Rouse |
| 6,503,805 | B2 | 1/2003 | Wang |
| 6,506,640 | B1 | 1/2003 | Ishida |
| 6,518,623 | B1 | 2/2003 | Oda |
| 6,521,470 | B1 | 2/2003 | Lin |
| 6,534,373 | B1 | 3/2003 | Yu |
| 6,541,328 | B2 | 4/2003 | Whang |
| 6,541,829 | B2 | 4/2003 | Nishinohara |
| 6,548,842 | B1 | 4/2003 | Bulucea |

(56) References Cited

U.S. PATENT DOCUMENTS

| | | |
|---|---|---|
| 6,551,885 B1 | 4/2003 | Yu |
| 6,552,377 B1 | 4/2003 | Yu |
| 6,573,129 B2 | 6/2003 | Hoke |
| 6,576,535 B2 | 6/2003 | Drobny |
| 6,600,200 B1 | 7/2003 | Lustig |
| 6,620,671 B1 | 9/2003 | Wang |
| 6,624,488 B1 | 9/2003 | Kim |
| 6,627,473 B1 | 9/2003 | Oikawa |
| 6,630,710 B1 | 10/2003 | Augusto |
| 6,660,605 B1 | 12/2003 | Liu |
| 6,662,350 B2 | 12/2003 | Fried |
| 6,667,200 B2 | 12/2003 | Sohn |
| 6,670,260 B1 | 12/2003 | Yu |
| 6,693,333 B1 | 2/2004 | Yu |
| 6,730,568 B2 | 5/2004 | Sohn |
| 6,737,724 B2 | 5/2004 | Hieda |
| 6,743,291 B2 | 6/2004 | Ang |
| 6,743,684 B2 | 6/2004 | Liu |
| 6,751,519 B1 | 6/2004 | Satya |
| 6,753,230 B2 | 6/2004 | Sohn |
| 6,760,900 B2 | 7/2004 | Rategh |
| 6,770,944 B2 | 8/2004 | Nishinohara |
| 6,787,424 B1 | 9/2004 | Yu |
| 6,797,553 B2 | 9/2004 | Adkisson |
| 6,797,602 B1 | 9/2004 | Kluth |
| 6,797,994 B1 | 9/2004 | Hoke |
| 6,808,004 B2 | 10/2004 | Kamm |
| 6,808,994 B1 | 10/2004 | Wang |
| 6,813,750 B2 | 11/2004 | Usami |
| 6,821,825 B2 | 11/2004 | Todd |
| 6,821,852 B2 | 11/2004 | Rhodes |
| 6,822,297 B2 | 11/2004 | Nandakumar |
| 6,831,292 B2 | 12/2004 | Currie |
| 6,835,639 B2 | 12/2004 | Rotondaro |
| 6,852,602 B2 | 2/2005 | Kanzawa |
| 6,852,603 B2 | 2/2005 | Chakravarthi |
| 6,881,641 B2 | 4/2005 | Wieczorek |
| 6,881,987 B2 | 4/2005 | Sohn |
| 6,891,439 B2 | 5/2005 | Jachne |
| 6,893,947 B2 | 5/2005 | Martinez |
| 6,900,519 B2 | 5/2005 | Cantell |
| 6,901,564 B2 | 5/2005 | Stine |
| 6,916,698 B2 | 7/2005 | Mocuta |
| 6,917,237 B1 | 7/2005 | Tschanz |
| 6,927,463 B2 | 8/2005 | Iwata |
| 6,928,128 B1 | 8/2005 | Sidiropoulos |
| 6,930,007 B2 | 8/2005 | Bu |
| 6,930,360 B2 | 8/2005 | Yamauchi |
| 6,957,163 B2 | 10/2005 | Ando |
| 6,963,090 B2 | 11/2005 | Passlack |
| 6,995,397 B2 | 2/2006 | Yamashita |
| 7,002,214 B1 | 2/2006 | Boyd |
| 7,008,836 B2 | 3/2006 | Algotsson |
| 7,013,359 B1 | 3/2006 | Li |
| 7,015,546 B2 | 3/2006 | Herr |
| 7,015,741 B2 | 3/2006 | Tschanz |
| 7,022,559 B2 | 4/2006 | Barnak |
| 7,036,098 B2 | 4/2006 | Eleyan |
| 7,038,258 B2 | 5/2006 | Liu |
| 7,039,881 B2 | 5/2006 | Regan |
| 7,045,456 B2 | 5/2006 | Murto |
| 7,057,216 B2 | 6/2006 | Ouyang |
| 7,061,058 B2 | 6/2006 | Chakravarthi |
| 7,064,039 B2 | 6/2006 | Liu |
| 7,064,399 B2 | 6/2006 | Babcock |
| 7,071,103 B2 | 7/2006 | Chan |
| 7,078,325 B2 | 7/2006 | Curello |
| 7,078,776 B2 | 7/2006 | Nishinohara |
| 7,089,513 B2 | 8/2006 | Bard |
| 7,089,515 B2 | 8/2006 | Hanafi |
| 7,091,093 B1 | 8/2006 | Noda |
| 7,105,399 B1 | 9/2006 | Dakshina-Murthy |
| 7,109,099 B2 | 9/2006 | Tan |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch |
| 7,169,675 B2 | 1/2007 | Tan |
| 7,170,120 B2 | 1/2007 | Datta |
| 7,176,137 B2 | 2/2007 | Perng |
| 7,186,598 B2 | 3/2007 | Yamauchi |
| 7,189,627 B2 | 3/2007 | Wu |
| 7,199,430 B2 | 4/2007 | Babcock |
| 7,202,517 B2 | 4/2007 | Dixit |
| 7,208,354 B2 | 4/2007 | Bauer |
| 7,211,871 B2 | 5/2007 | Cho |
| 7,221,021 B2 | 5/2007 | Wu |
| 7,223,646 B2 | 5/2007 | Miyashita |
| 7,226,833 B2 | 6/2007 | White |
| 7,226,843 B2 | 6/2007 | Weber |
| 7,230,680 B2 | 6/2007 | Fujisawa |
| 7,235,822 B2 | 6/2007 | Li |
| 7,256,639 B1 | 8/2007 | Koniaris |
| 7,259,428 B2 | 8/2007 | Inaba |
| 7,260,562 B2 | 8/2007 | Czajkowski |
| 7,294,877 B2 | 11/2007 | Rueckes |
| 7,297,994 B2 | 11/2007 | Wieczorek |
| 7,301,208 B2 | 11/2007 | Handa |
| 7,304,350 B2 | 12/2007 | Misaki |
| 7,307,471 B2 | 12/2007 | Gammie |
| 7,312,500 B2 | 12/2007 | Miyashita |
| 7,323,754 B2 | 1/2008 | Ema |
| 7,332,439 B2 | 2/2008 | Lindert |
| 7,348,629 B2 | 3/2008 | Chu |
| 7,354,833 B2 | 4/2008 | Liaw |
| 7,380,225 B2 | 5/2008 | Joshi |
| 7,398,497 B2 | 7/2008 | Sato |
| 7,402,207 B1 | 7/2008 | Besser |
| 7,402,872 B2 | 7/2008 | Murthy |
| 7,416,605 B2 | 8/2008 | Zollner |
| 7,427,788 B2 | 9/2008 | Li |
| 7,442,971 B2 | 10/2008 | Wirbeleit |
| 7,449,733 B2 | 11/2008 | Inaba |
| 7,462,908 B2 | 12/2008 | Bol |
| 7,469,164 B2 | 12/2008 | Du-Nour |
| 7,470,593 B2 | 12/2008 | Rouh |
| 7,485,536 B2 | 2/2009 | Jin |
| 7,487,474 B2 | 2/2009 | Ciplickas |
| 7,491,988 B2 | 2/2009 | Tolchinsky |
| 7,494,861 B2 | 2/2009 | Chu |
| 7,496,862 B2 | 2/2009 | Chang |
| 7,496,867 B2 | 2/2009 | Turner |
| 7,498,637 B2 | 3/2009 | Yamaoka |
| 7,501,324 B2 | 3/2009 | Babcock |
| 7,503,020 B2 | 3/2009 | Allen |
| 7,507,999 B2 | 3/2009 | Kusumoto |
| 7,514,766 B2 | 4/2009 | Yoshida |
| 7,521,323 B2 | 4/2009 | Surdeanu |
| 7,531,393 B2 | 5/2009 | Doyle |
| 7,531,836 B2 | 5/2009 | Liu |
| 7,538,364 B2 | 5/2009 | Twynam |
| 7,538,412 B2 | 5/2009 | Schulze |
| 7,562,233 B1 | 7/2009 | Sheng |
| 7,564,105 B2 | 7/2009 | Chi |
| 7,566,600 B2 | 7/2009 | Mouli |
| 7,569,456 B2 | 8/2009 | Ko |
| 7,586,322 B1 | 9/2009 | Xu |
| 7,592,241 B2 | 9/2009 | Takao |
| 7,595,243 B1 | 9/2009 | Bulucea |
| 7,598,142 B2 | 10/2009 | Ranade |
| 7,605,041 B2 | 10/2009 | Ema |
| 7,605,060 B2 | 10/2009 | Meunier-Beillard |
| 7,605,429 B2 | 10/2009 | Bernstein |
| 7,608,496 B2 | 10/2009 | Chu |
| 7,615,802 B2 | 11/2009 | Elpelt |
| 7,622,341 B2 | 11/2009 | Chudzik |
| 7,638,380 B2 | 12/2009 | Pearce |
| 7,642,140 B2 | 1/2010 | Bae |
| 7,644,377 B1 | 1/2010 | Saxe |
| 7,645,665 B2 | 1/2010 | Kubo |
| 7,651,920 B2 | 1/2010 | Siprak |
| 7,655,523 B2 | 2/2010 | Babcock |
| 7,673,273 B2 | 3/2010 | Madurawe |
| 7,675,126 B2 | 3/2010 | Cho |

(56) References Cited

U.S. PATENT DOCUMENTS

| | | |
|---|---|---|
| 7,675,317 B2 | 3/2010 | Perisetty |
| 7,678,638 B2 | 3/2010 | Chu |
| 7,681,628 B2 | 3/2010 | Joshi |
| 7,682,887 B2 | 3/2010 | Dokumaci |
| 7,683,442 B1 | 3/2010 | Burr |
| 7,696,000 B2 | 4/2010 | Liu |
| 7,704,822 B2 | 4/2010 | Jeong |
| 7,704,844 B2 | 4/2010 | Zhu |
| 7,709,828 B2 | 5/2010 | Braithwaite |
| 7,723,750 B2 | 5/2010 | Zhu |
| 7,737,472 B2 | 6/2010 | Kondo |
| 7,741,138 B2 | 6/2010 | Cho |
| 7,741,200 B2 | 6/2010 | Cho |
| 7,745,270 B2 | 6/2010 | Shah |
| 7,750,374 B2 | 7/2010 | Capasso |
| 7,750,381 B2 | 7/2010 | Hokazono |
| 7,750,405 B2 | 7/2010 | Nowak |
| 7,750,682 B2 | 7/2010 | Bernstein |
| 7,755,144 B2 | 7/2010 | Li |
| 7,755,146 B2 | 7/2010 | Helm |
| 7,759,206 B2 | 7/2010 | Luo |
| 7,759,714 B2 | 7/2010 | Itoh |
| 7,761,820 B2 | 7/2010 | Berger |
| 7,795,677 B2 | 9/2010 | Bangsaruntip |
| 7,808,045 B2 | 10/2010 | Kawahara |
| 7,808,410 B2 | 10/2010 | Kim |
| 7,811,873 B2 | 10/2010 | Mochizuki |
| 7,811,881 B2 | 10/2010 | Cheng |
| 7,818,702 B2 | 10/2010 | Mandelman |
| 7,821,066 B2 | 10/2010 | Lebby |
| 7,829,402 B2 | 11/2010 | Matocha |
| 7,831,873 B1 | 11/2010 | Trimberger |
| 7,846,822 B2 | 12/2010 | Seebauer |
| 7,855,118 B2 | 12/2010 | Hoentschel |
| 7,859,013 B2 | 12/2010 | Chen |
| 7,863,163 B2 | 1/2011 | Bauer |
| 7,867,835 B2 | 1/2011 | Lee |
| 7,883,977 B2 | 2/2011 | Babcock |
| 7,888,205 B2 | 2/2011 | Herner |
| 7,888,747 B2 | 2/2011 | Hokazono |
| 7,895,546 B2 | 2/2011 | Lahner |
| 7,897,495 B2 | 3/2011 | Ye |
| 7,906,413 B2 | 3/2011 | Cardone |
| 7,906,813 B2 | 3/2011 | Kato |
| 7,910,419 B2 | 3/2011 | Fenouillet-Beranger |
| 7,919,791 B2 | 4/2011 | Flynn |
| 7,926,018 B2 | 4/2011 | Moroz |
| 7,935,984 B2 | 5/2011 | Nakano |
| 7,941,776 B2 | 5/2011 | Majumder |
| 7,945,800 B2 | 5/2011 | Gomm |
| 7,948,008 B2 | 5/2011 | Liu |
| 7,952,147 B2 | 5/2011 | Ueno |
| 7,960,232 B2 | 6/2011 | King |
| 7,960,238 B2 | 6/2011 | Kohli |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell |
| 7,989,900 B2 | 8/2011 | Haensch |
| 7,994,573 B2 | 8/2011 | Pan |
| 8,004,024 B2 | 8/2011 | Furukawa |
| 8,012,827 B2 | 9/2011 | Yu |
| 8,029,620 B2 | 10/2011 | Kim |
| 8,039,332 B2 | 10/2011 | Bernard |
| 8,046,598 B2 | 10/2011 | Lee |
| 8,048,791 B2 | 11/2011 | Hargrove |
| 8,048,810 B2 | 11/2011 | Tsai |
| 8,051,340 B2 | 11/2011 | Cranford, Jr. |
| 8,053,340 B2 | 11/2011 | Colombeau |
| 8,063,466 B2 | 11/2011 | Kurita |
| 8,067,279 B2 | 11/2011 | Sadra |
| 8,067,280 B2 | 11/2011 | Wang |
| 8,067,302 B2 | 11/2011 | Li |
| 8,076,719 B2 | 12/2011 | Zeng |
| 8,097,529 B2 | 1/2012 | Krull |
| 8,103,983 B2 | 1/2012 | Agarwal |
| 8,105,891 B2 | 1/2012 | Yeh |
| 8,106,424 B2 | 1/2012 | Schruefer |
| 8,106,481 B2 | 1/2012 | Rao |
| 8,110,487 B2 | 2/2012 | Griebenow |
| 8,114,761 B2 | 2/2012 | Mandrekar |
| 8,119,482 B2 | 2/2012 | Bhalla |
| 8,120,069 B2 | 2/2012 | Hynecek |
| 8,129,246 B2 | 3/2012 | Babcock |
| 8,129,797 B2 | 3/2012 | Chen |
| 8,134,159 B2 | 3/2012 | Hokazono |
| 8,143,120 B2 | 3/2012 | Kerr |
| 8,143,124 B2 | 3/2012 | Challa |
| 8,143,678 B2 | 3/2012 | Kim |
| 8,148,774 B2 | 4/2012 | Mori |
| 8,163,619 B2 | 4/2012 | Yang |
| 8,169,002 B2 | 5/2012 | Chang |
| 8,170,857 B2 | 5/2012 | Joshi |
| 8,173,499 B2 | 5/2012 | Chung |
| 8,173,502 B2 | 5/2012 | Yan |
| 8,176,461 B1 | 5/2012 | Trimberger |
| 8,178,430 B2 | 5/2012 | Kim |
| 8,179,530 B2 | 5/2012 | Levy |
| 8,183,096 B2 | 5/2012 | Wirbeleit |
| 8,183,107 B2 | 5/2012 | Mathur |
| 8,185,865 B2 | 5/2012 | Gupta |
| 8,187,959 B2 | 5/2012 | Pawlak |
| 8,188,542 B2 | 5/2012 | Yoo |
| 8,196,545 B2 | 6/2012 | Kurosawa |
| 8,201,122 B2 | 6/2012 | Dewey, III |
| 8,214,190 B2 | 7/2012 | Joshi |
| 8,217,423 B2 | 7/2012 | Liu |
| 8,225,255 B2 | 7/2012 | Ouyang |
| 8,227,307 B2 | 7/2012 | Chen |
| 8,236,661 B2 | 8/2012 | Dennard |
| 8,239,803 B2 | 8/2012 | Kobayashi |
| 8,247,300 B2 | 8/2012 | Babcock |
| 8,255,843 B2 | 8/2012 | Chen |
| 8,258,026 B2 | 9/2012 | Bulucea |
| 8,266,567 B2 | 9/2012 | El Yahyaoui |
| 8,286,180 B2 | 10/2012 | Foo |
| 8,288,798 B2 | 10/2012 | Passlack |
| 8,299,562 B2 | 10/2012 | Li |
| 8,324,059 B2 | 12/2012 | Guo |
| 2001/0014495 A1 | 8/2001 | Yu |
| 2002/0042184 A1 | 4/2002 | Nandakumar |
| 2003/0006415 A1 | 1/2003 | Yokogawa |
| 2003/0047763 A1 | 3/2003 | Hieda |
| 2003/0122203 A1 | 7/2003 | Nishinohara |
| 2003/0173626 A1 | 9/2003 | Burr |
| 2003/0183856 A1 | 10/2003 | Wieczorek |
| 2003/0215992 A1 | 11/2003 | Sohn |
| 2004/0075118 A1 | 4/2004 | Heinemann |
| 2004/0075143 A1 | 4/2004 | Bae |
| 2004/0084731 A1 | 5/2004 | Matsuda |
| 2004/0087090 A1 | 5/2004 | Grudowski |
| 2004/0126947 A1 | 7/2004 | Sohn |
| 2004/0175893 A1 | 9/2004 | Vatus |
| 2004/0180488 A1 | 9/2004 | Lee |
| 2005/0106824 A1 | 5/2005 | Alberto |
| 2005/0116282 A1 | 6/2005 | Pattanayak |
| 2005/0250289 A1 | 11/2005 | Babcock |
| 2005/0280075 A1 | 12/2005 | Ema |
| 2006/0022270 A1 | 2/2006 | Boyd |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2006/0197158 A1 | 9/2006 | Babcock |
| 2006/0203581 A1 | 9/2006 | Joshi |
| 2006/0220114 A1 | 10/2006 | Miyashita |
| 2006/0223248 A1 | 10/2006 | Venugopal |
| 2007/0040222 A1 | 2/2007 | Van Camp |
| 2007/0117326 A1 | 5/2007 | Tan |
| 2007/0158790 A1 | 7/2007 | Rao |
| 2007/0212861 A1 | 9/2007 | Chidambarrao |
| 2007/0238253 A1 | 10/2007 | Tucker |
| 2008/0067589 A1 | 3/2008 | Ito |

(56) References Cited

U.S. PATENT DOCUMENTS

| | | |
|---|---|---|
| 2008/0108208 A1 | 5/2008 | Arevalo |
| 2008/0169493 A1 | 7/2008 | Lee |
| 2008/0169516 A1 | 7/2008 | Chung |
| 2008/0197439 A1 | 8/2008 | Goerlach |
| 2008/0227250 A1 | 9/2008 | Ranade |
| 2008/0237661 A1 | 10/2008 | Ranade |
| 2008/0258198 A1 | 10/2008 | Bojarczuk |
| 2008/0272409 A1 | 11/2008 | Sonkusale |
| 2009/0057746 A1 | 3/2009 | Sugll |
| 2009/0108350 A1 | 4/2009 | Cai |
| 2009/0134468 A1 | 5/2009 | Tsuchiya |
| 2009/0224319 A1 | 9/2009 | Kohli |
| 2009/0302388 A1 | 12/2009 | Cai |
| 2009/0309140 A1 | 12/2009 | Khamankar |
| 2009/0311837 A1 | 12/2009 | Kapoor |
| 2009/0321849 A1 | 12/2009 | Miyamura |
| 2010/0012988 A1 | 1/2010 | Yang |
| 2010/0038724 A1 | 2/2010 | Anderson |
| 2010/0100856 A1 | 4/2010 | Mittal |
| 2010/0148153 A1 | 6/2010 | Hudait |
| 2010/0149854 A1 | 6/2010 | Vora |
| 2010/0187641 A1 | 7/2010 | Zhu |
| 2010/0207182 A1 | 8/2010 | Paschal |
| 2010/0270600 A1 | 10/2010 | Inukai |
| 2011/0059588 A1 | 3/2011 | Kang |
| 2011/0073961 A1 | 3/2011 | Dennard |
| 2011/0074498 A1 | 3/2011 | Thompson |
| 2011/0079860 A1 | 4/2011 | Verhulst |
| 2011/0079861 A1 | 4/2011 | Shifren |
| 2011/0095811 A1 | 4/2011 | Chi |
| 2011/0147828 A1 | 6/2011 | Murthy |
| 2011/0169082 A1 | 7/2011 | Zhu |
| 2011/0175170 A1 | 7/2011 | Wang |
| 2011/0180880 A1 | 7/2011 | Chudzik |
| 2011/0193164 A1 | 8/2011 | Zhu |
| 2011/0212590 A1 | 9/2011 | Wu |
| 2011/0230039 A1 | 9/2011 | Mowry |
| 2011/0242921 A1 | 10/2011 | Tran |
| 2011/0248352 A1 | 10/2011 | Shifren |
| 2011/0294278 A1 | 12/2011 | Eguchi |
| 2011/0309447 A1 | 12/2011 | Arghavani |
| 2012/0021594 A1 | 1/2012 | Gurtej |
| 2012/0034745 A1 | 2/2012 | Colombeau |
| 2012/0056275 A1 | 3/2012 | Cai |
| 2012/0065920 A1 | 3/2012 | Nagumo |
| 2012/0108050 A1 | 5/2012 | Chen |
| 2012/0132998 A1 | 5/2012 | Kwon |
| 2012/0138953 A1 | 6/2012 | Cai |
| 2012/0146155 A1 | 6/2012 | Hoentschel |
| 2012/0167025 A1 | 6/2012 | Gillespie |
| 2012/0187491 A1 | 7/2012 | Zhu |
| 2012/0190177 A1 | 7/2012 | Kim |
| 2012/0223363 A1 | 9/2012 | Kronholz |

FOREIGN PATENT DOCUMENTS

| | | |
|---|---|---|
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 794094 | 1/2008 |
| WO | WO 2011/062788 | 5/2011 |

OTHER PUBLICATIONS

Cheng, et al. "Extremely Thin SOI (ETSOI) CMOS with Record Low Variability for Low Power System-on-Chip Applications", Electron Devices Meeting (IEDM) (Dec. 2009).

Cheng, et al. "Fully Depleted Extremely Thin SOI Technology Fabricated by a Novel Integration Scheme Feturing Implant-Free, Zero-Silicon-Loss, and Faceted Raised Source/Drain", Symposium on VLSI Technology Digest of Technical Papers, pp. 212-213 (2009).

Drennan, et al. "Implications of Proximity Effects for Analog Design", Custom Integrated Circuits Conference, pp. 169-176 (Sep. 2006).

Hook, et al. "Lateral Ion Implant Straggle and Mask Proximity Effect", IEEE Transactions on Electron Devices, vol. 50, No. 9, pp. 1946-1951 (Sep. 2003).

Hori, et al., "A 0.1 µm CMOS with a Step Channel Profile Formed by Ultra High Vacuum CVD and In-Situ Doped Ions", Proceedsing of the International Electron Devices Meeting, New York, IEEE, US, pp. 909-911 (Dec. 1993).

Matshuashi, et al. "High-Performance Double-Layer Epitaxial-Channel PMOSFET Compatible with a Single Gate CMOSFET", Symposium on VLSI Technology Digest of Technical Papers, pp. 36-37 (1996).

Shao, et al., "Boron Diffusion in Silicon: The Anomalies and Control by Point Defect Engineering", Materials Science and Engineering R: Reports, vol. 42, No. 3-4, pp. 65-114, (2003).

Sheu, et al. "Modeling the Well-Edge Proximity Effect in Highly Scaled MOSFETs", IEEE Transactions on Electron Devices, vol. 53, No. 11, pp. 2792-2798 (Nov. 2006).

Abiko, H et al., "A Channel Engineering Combined with Channel Epitaxy Optimization and TED Suppression for 0.15 µm n-n Gate CMOS Technology", 1995 Symposium on VLSI Technology Digest of Technical Papers, pp. 23-24 (1995).

Chau, R et al., "A 50nm Depleted-Substrate CMOS Transistor (DST)", Electron Device Meeting 2001, IEDM Technical Digest, IEEE International, pp. 29.1.1-29.1.4 (2001).

Ducroquet, F et al. "Fully Depleted Silicon-On-Insulator nMOSFETs with Tensile Strained High Carbon Content $Si_{1-y}C_y$ Channel", ECS 210th Meeting, Abstract 1033 (2006).

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961 (2006).

Goesele, U et al., Diffusion Engineering by Carbon in Silicon, Mat. Res. Soc. Symp. vol. 610 (2000).

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113 (2008).

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4 (2009).

Holland, OW and Thomas, DK "A Method to Improve Activation of Implanted Dopants in SiC", Oak Ridge National Laboratory, Oak Ridge, TN (2001).

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462 (1996).

Lavéant, P. "Incorporation, Diffusion and Agglomeration of Carbon in Silicon", Solid State Phenomena, vols. 82-84, pp. 189-194 (2002).

Noda, K et al., "A 0.1-µm Delta-Doped MOSFET Fabricated with Post-Low-Energy Implanting Selective Epitaxy" IEEE Transactions on Electron Devices, vol. 45, No. 4, pp. 809-814 (Apr. 1998).

Ohguro, T et al., "An 0.18-µm CMOS for Mixed Digital and Analog Aplications with Zero-Volt-Vth Epitaxial-Channel MOSFET's", IEEE Transactions on Electron Devices, vol. 46, No. 7, pp. 1378-1383 (Jul. 1999).

Pinacho, R et al., "Carbon in Silicon: Modeling of Diffusion and Clustering Mechanisms", Journal of Applied Physics, vol. 92, No. 3, pp. 1582-1588 (Aug. 2002).

Robertson, LS et al., "The Effect of Impurities on Diffusion and Activation of Ion Implanted Boron in Silicon", Mat. Res. Soc. Symp. vol. 610 (2000).

Scholz, R et al., "Carbon-Induced Undersaturation of Silicon Self-Interstitials", Appl. Phys. Lett. 72(2), pp. 200-202 (Jan. 1998).

(56) References Cited

OTHER PUBLICATIONS

Scholz, RF et al., "The Contribution of Vacancies to Carbon Out-Diffusion in Silicon", Appl. Phys. Lett., vol. 74, No. 3, pp. 392-394 (Jan. 1999).
Stolk, PA et al., "Physical Mechanisms of Transient Enhanced Dopant Diffusion in Ion-Implanted Silicon", J. Appl. Phys. 81(9), pp. 6031-6050 (May 1997).
Thompson, S et al., "MOS Scaling: Transistor Challenges for the 21st Century", Intel Technology Journal Q3' 1998, pp. 1-19 (1998).
Wann, C. et al., "Channel Profile Optimization and Device Design for Low-Power High-Performance Dynamic-Threshold MOSFET", IEDM 96, pp. 113-116 (1996).
Werner, P et al., "Carbon Diffusion in Silicon", Applied Physics Letters, vol. 73, No. 17, pp. 2465-2467 (Oct. 1998).
Yan, Ran-Hong et al., "Scaling the Si MOSFET: From Bulk to SOI to Bulk", IEEE Transactions on Electron Devices, vol. 39, No. 7 (Jul. 1992).
Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, (Dec. 13-15, 2004).
Samsudin, K et al., "Integrating Intrinsic Parameter Fluctuation Description into BSIMSOI to Forecast sub-15nm UTB SOI based 6T SRAM Operation", Solid-State Electronics (50), pp. 86-93 (2006).
Wong, H et al., "Nanoscale CMOS", Proceedings of the IEEE, Vo. 87, No. 4, pp. 537-570 (Apr. 1999).

\* cited by examiner

BURIED CHANNEL DEEPLY DEPLETED CHANNEL TRANSISTOR

CROSS-REFERENCE TO RELATED APPLICATIONS

This application is a divisional of U.S. application Ser. No. 14/286,063 filed May 23, 2014 and entitled "Buried Channel Deeply Depleted Channel Transistor, which claims priority to and the benefit of U.S. Provisional Patent Application No. 61/827,070, filed May 24, 2013 and entitled "Image Sensor Transistor and Circuit", the contents of which are herein incorporated by reference in their entirety.

FIELD OF THE INVENTION

The present technology relates to deeply depleted channel transistors, and more specifically to methods for fabricating buried channel deeply depleted channel transistors and devices therefrom.

BACKGROUND

Pixel-based image sensors are often required to operate with extremely low signal levels, making them susceptible to electrical noise and thermal noise. Among the various types of noise sources, one particular limiting factor for an image sensor cell to achieve a lower noise detection floor is the random telegraph (RTS) noise of the source follower transistor. RTS noise affects the output of the image sensor circuit with small, random jitters, positive and negative, in the output signal. RTS noise is generally caused by trapping and detrapping of electrons or holes associated with defects at or near the gate oxide/channel interface in a transistor.

Unfortunately, the presence of the RTS noise and the resulting inaccuracies in reading pixel values of an image sensor may produce inaccurate or noisy images. One way of reducing RTS noise is to make use of buried channel transistors. Buried channel transistors are typically formed by counter-doping the channel region of a planar MOS (metal-oxide semiconductor) transistor. In buried channel transistors, the doping structure in the channel region provides a conducting channel at zero gate bias. The buried channel transistor is then turned off by depleting the channel region with an appropriate gate bias voltage. In the intended operation regime, some bias is applied so that the conducting portion of the channel remains separated from the gate oxide/channel interface. This significantly reduces the probability of the carriers being trapped by the defects at the oxide/channel interface. Accordingly, the buried channel transistor is expected to exhibit less RTS noise since carriers are less likely to be associated with trapping/detrapping events.

Unfortunately, conventional buried channel transistors are more sensitive to short channel effects which reduce their effectiveness as switches and limits scaling thereof. For example, buried channel transistors are more prone to two-dimensional (2D) effects, like the drain-induced barrier lowering, threshold voltage (Vt) roll-off with decreasing channel length, and punch-through. In some types of image sensor circuits, these disadvantages can outweigh any advantages associated with the lower RTS provided by the conventional buried channel transistor.

BRIEF DESCRIPTION OF THE DRAWINGS

The figures provide exemplary and non-limiting descriptions of the disclosed technology.

DETAILED DESCRIPTION

The present technology is described with reference to the attached figures, wherein like reference numerals are used throughout the figures to designate similar or equivalent elements. The figures are not drawn to scale and they are provided merely to illustrate the instant technology. Several aspects of the technology are described below with reference to example applications for illustration. It should be understood that numerous specific details, relationships, and methods are set forth to provide a full understanding of the technology. One having ordinary skill in the relevant art, however, will readily recognize that the technology can be practiced without one or more of the specific details or with other methods. In other instances, well-known structures or operations are not shown in detail to avoid obscuring the technology. The present technology is not limited by the illustrated ordering of acts or events, as some acts may occur in different orders and/or concurrently with other acts or events. Furthermore, not all illustrated acts or events are required to implement a methodology in accordance with the present technology.

In view of the limitations of existing buried channel transistors for image sensors and other applications, the present technology is directed to an improved buried channel transistor that enables low RTS noise while avoiding short channel effects. Thus, the buried channel transistors of the present technology can be effectively implemented as the source follower in an image sensor circuit to provide in overall reduced read out noise at an image sensor or other device.

The improved buried channel transistor of the present technology, suitable for image sensor circuits, low noise amplifier circuits, or other noise susceptible circuits, can be fabricated in accordance with the structures and techniques associated with deeply depleted channel (DDC) transistors. DDC transistors are MOS transistors that include a highly doped screening layer or region, over which an epitaxial layer is grown to support a channel between a source and drain. The presence of a screening region, among other things, reduces short channel effects including, but not limited to, two-dimensional (2D) effects, like drain-induced barrier lowering, Vt roll-off with decreasing channel length, and punch-through.

Further, DDC transistors have improved Vt variation and therefore allow for greater scaling of operating voltages. Consequently, DDC transistors allow more reliable setting of Vt's, improved device characteristics (e.g., mobility, transconductance, and drive current), strong body coefficient, and reduced junction capacitance are provided. Also, doping profiles can be selected for DDC transistors to provide different Vt targets for the different transistor device types without the use of pocket or halo implants or without the need for channel implantation adjacent to the gate oxide.

Figure 1:
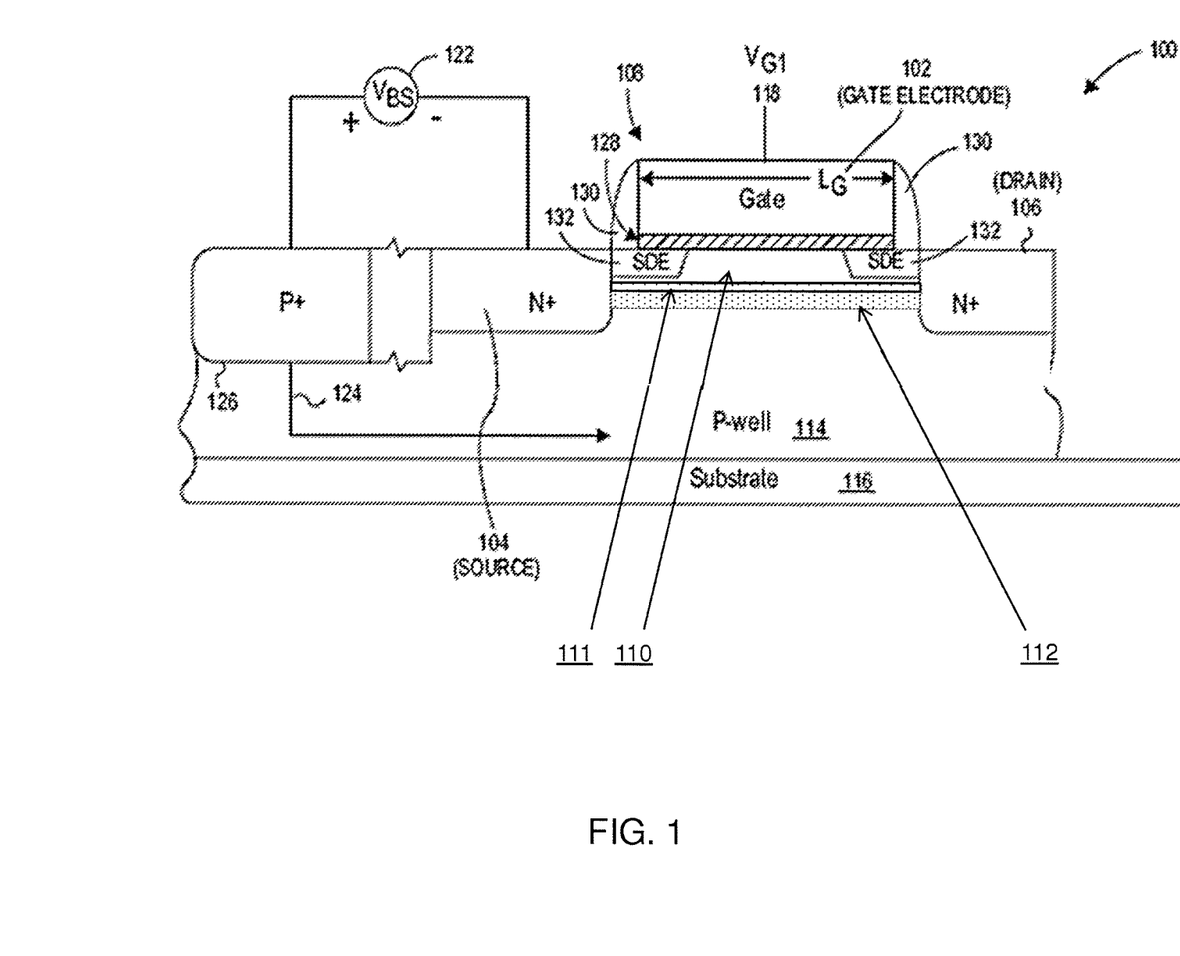
FIG. 1 is an example cross-section of a version of a typical DDC transistor.

For illustrative purposes, FIG. 1 shows an embodiment of a conventional DDC transistor 100. The DDC transistor 100 includes a gate electrode 102, source 104, drain 106, and a gate dielectric 128 positioned over a substantially undoped channel 110. Lightly doped source and drain extensions (SDE) 132, positioned respectively adjacent to source 104 and drain 106, extend toward each other, setting the transistor channel length.

The DDC transistor 100 is shown as an N-channel transistor having a source 104 and drain 106 made of N-type dopant material, formed upon a semiconductor substrate such as a P-type doped silicon substrate providing a P-well 114 formed on a substrate 116.

In the present disclosure, the terms "semiconductor substrate" or "substrate" refer to any type of substrate used for forming semiconductor devices thereon, including single crystal substrates, semiconductor on insulator (SOI) substrates, and epitaxial film on semiconductor (EPI) substrates, to name a few. Further, although the various embodiments will be primarily described with respect to materials and processes compatible with silicon-based semiconductor materials (e.g., silicon and alloys of silicon with germanium and/or carbon), the present technology is not limited in this regard. Rather, the various embodiments can be implemented using any types of semiconductor materials.

The N-channel DDC transistor in FIG. 1 also includes a highly doped screening region 112 made of P-type dopant material extending between the source 104 and drain 106. Additionally, a Vt set region 111 made of P-type dopant material can also be provided. Above the screening region 112, the DDC transistor 100 includes a substantially undoped channel 110. The undoped channel 110 can be formed using epitaxially-grown silicon or any other deposition technique that is intended to result in undoped crystalline silicon. As used herein, the term "undoped" refers to an effective or active dopant concentration or density of less than $5 \times 10^{17}$ atoms/cm$^3$ and the terms "active dopant concentration" or "effective dopant concentration" refer to the concentration of dopants that are electrically active in the semiconductor material to provide holes or electrons.

The DDC transistor 100 can be used to provide various transistor device types. Such transistor device types include, but are not limited to: PFETs, NFETs, FETs tailored for digital or analog circuit applications, high-voltage FETs, high/normal/low frequency FETs, FETs optimized to work at distinct voltages or voltage ranges, low/high power FETs, and low, regular, or high Vt transistors (i.e. low Vt, regular Vt, or high Vt—also referred to as LVt, RVt, or HVt, respectively), etc. Transistor device types are usually distinguished by electrical characteristics (e.g. Vt, mobility, transconductance, linearity, noise, power), which in turn can lend themselves to be suitable for a particular application (e.g., signal processing or data storage). Since a complex integrated circuit such as, for instance, a system on a chip (SoC) can include many different circuit blocks having different transistor device types to achieve the desired circuit performance, it is desirable to use a transistor structure that can be readily fabricated to result in the various transistor device types.

A typical process for forming the DDC transistor 100 may begin with forming the screening region 112. In certain embodiments, the screening region is formed by providing the substrate 116 having the P-well 114 and implanting screening region dopant material thereon. Other methods may be used to form the screening region such as in-situ doped epitaxial silicon deposition, or epitaxial silicon deposition followed by vertically directed dopant implantation to result in a heavily doped region embedded a vertical distance downward from gate 102. In particular embodiments, the screening region has a defined thickness, shown in FIG. 1 as being approximately ⅓ to ¼ the vertical thickness of the source and drain 104 and 106 and is positioned such that the top surface of the screening region is located approximately at a distance of Lg/1.5 to Lg/5 below the gate (where Lg is the gate length). The screening region can be formed before or after STI (shallow trench isolation) formation.

For silicon-based DDC transistors, Boron (B), Indium (I), or other P-type materials may be used for NMOS screening region dopants, and arsenic (As), antimony (Sb) or phosphorous (P) and other N-type materials can be used for PMOS screening region dopants. The screening region 112 in a typical DDC transistor can have a significant effective dopant concentration, which can range between about $5 \times 10^{18}$ to $1 \times 10^{20}$ dopant atoms/cm$^3$. Generally, if the screening region 112 of a DDC transistor has a dopant concentration on the higher end of the range, the screening region 112 can simultaneously function as the Vt setting region for the DDC transistor.

For all process steps occurring after the placement of screening region dopants, these can be performed within a low thermal budget to avoid dopant migration from the screening region 112, that is, temperature settings for subsequent steps being optimized for performing the steps effectively without causing unwanted dopant migration or undesired degree of dopant migration from the screening region 112. A dopant migration resistant layer can be formed above the screening region to reduce upward migration of dopants. This layer can include germanium (Ge), carbon (C), or other dopants that inhibit dopant migration and is particularly useful for boron-doped screening regions, the boron being a more diffusive material than other dopant materials. The dopant migration resistant layer can be formed by way of ion implantation, in-situ doped epitaxial growth or other process.

As noted above, a Vt set region 111 can be positioned above the screening region 112. The Vt set region 111 can be either adjacent to, incorporated within or vertically offset from the screening region. In certain configurations, the Vt set region 111 is formed by implanting dopants into the screening region 112 via delta doping, controlled in-situ deposition, or atomic layer deposition. In alternative embodiments, the Vt set region 111 can be formed by way of controlled out-diffusion of dopant material from the screening region 112 into the undoped channel 110 using a predetermined thermal cycling recipe effective to cause a desired diffusion of dopants from the screening region 112 to form the Vt set region 111. Preferably, the Vt set region 111 is formed before the undoped epitaxial layer is formed, though exceptions may apply. The Vt is designed by targeting a dopant concentration and thickness of the Vt set region 111 suitable to achieve the Vt desired for the device. As noted above, if the screening region 112 concentration is sufficiently high, then the screening region 112 can function as the Vt setting region and a separate Vt setting region is not needed.

Typically, the Vt set region 111 is fabricated to be a defined distance below gate dielectric 128, preferably a vertical distance of ⅕ to ½ times the channel length, leaving a substantially undoped channel layer directly adjacent to the gate dielectric 128. The dopant concentration for the Vt set region 111 depends on the desired Vt for the device taking into account the location of the Vt set region 111 relative to the gate. In certain cases, the Vt set region 111 has an effective dopant concentration between about $1\times10^{18}$ dopant atoms/cm$^3$ and about $1\times10^{19}$ dopant atoms per cm$^3$. Alternatively, the Vt set region 111 can be designed to have an effective dopant concentration that is approximately one third to one half of the concentration of dopants in the screening region 112.

The final layer of the channel is formed preferably by way of a blanket epitaxial silicon deposition, although selective epitaxial deposition may be used. The channel 110 is structured above the screening region 112 and Vt set region 111, having a selected thickness tailored to the electrical specifications of the device. The thickness of the undoped channel region 110 (preferably having a conductivity-altering dopant concentration of less than $5\times10^{17}$ atoms per cm$^3$) can range from approximately 5-25 nm, where a thicker undoped channel region 110 is usually used for a lower Vt device. As noted above, to achieve the desired undoped channel region 110 thickness, a thermal cycle may be used to cause an out-diffusion of dopants from the screening region 112 into a portion of the epitaxial layer to result in a Vt set region 111 for a given undoped channel region 110 thickness. Isolation structures are preferably formed after the channel region 110 is formed, but isolation may also be formed beforehand, particularly if selective epitaxy is used to form the channel region 110.

The DDC transistor 100 is then completed by forming a gate electrode 102 which may include a polysilicon gate or a metal gate stack, as well as SDE 132, spacers 130, and source 104 and drain 106 structures using conventional fabrication methods.

Further examples of transistor structure and manufacture suitable for use in DDC transistors are disclosed in U.S. Pat. No. 8,273,617, titled "Electronic Devices and Systems, and Methods for Making and Using the Same", by Scott E. Thompson et al., U.S. patent application Ser. No. 12/895,785 filed Sep. 30, 2010, titled "Advanced Transistors with Vt Set Dopant Structures", by Lucian Shifren et al., U.S. Pat. No. 8,421,162, titled "Advanced Transistors with Punch Through Suppression", by Lucian Shifren et al., U.S. Pat. No. 8,530,286, titled "Low Power Semiconductor Transistor Structure and Method of Fabrication Thereof", U.S. patent application Ser. No. 12/971,955 filed on Dec. 17, 2010, titled "Transistor with Vt Set Notch and Method of Fabrication Thereof", by Reza Arghavani et al., U.S. patent application Ser. No. 13/926,555 filed on Jun. 25, 2013, titled "Semiconductor Structure with Multiple Transistors having Various Threshold Voltages and Method of Fabrication Thereof", by Zhao et al., and U.S. patent application Ser. No. 13/482,394 filed on May 29, 2012, titled "Method for Substrate Preservation During Transistor Fabrication", by Lance Scudder et al., the respective contents of which are incorporated by reference herein in their entirety.

The present technology leverages main attributes of a DDC transistor architecture to alleviate the problems with conventional buried channel transistors. In particular, advantageous structures in a DDC transistor (for instance, formation of the highly doped screening region and the substantially undoped channel) can be used to improve the operation of buried channel transistors, to provide advantageous uses for buried channel transistors for instance, for use as a source follower transistor on an image sensor chip. As a result, the buried channel transistors of the present technology enable scaling of the buried channel device by avoiding significant short channel effects (due to the DDC components) and at the same time provide the needed low RTS noise characteristics (due to the buried channel).

Figure 2:
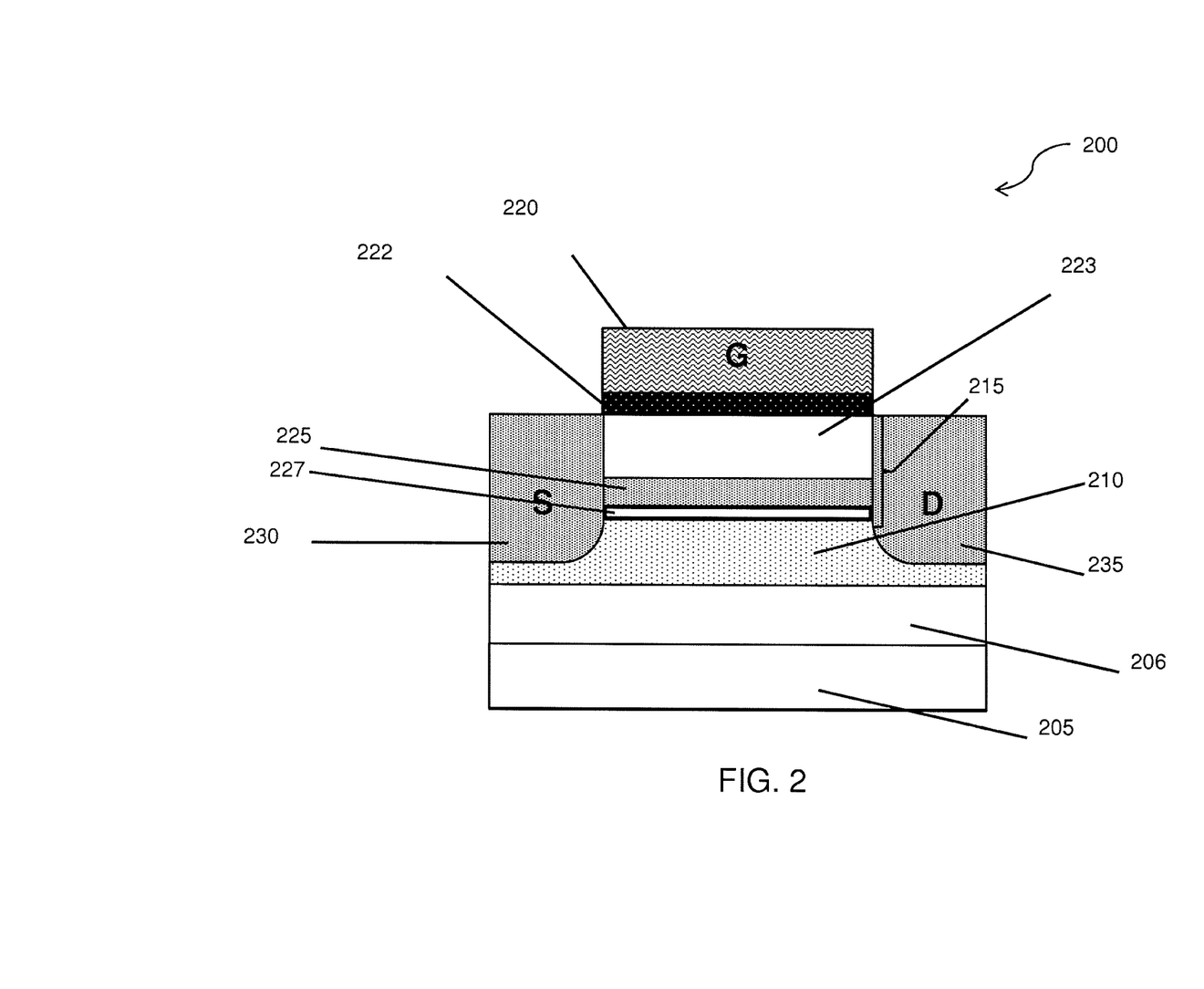
FIG. 2 is an example cross-section of a version of a buried channel DDC transistor in accordance with the present technology.

FIG. 2 is an exemplary cross-sectional view of a DDC-buried channel (DDC-BC) transistor 200, under bias conditions, in accordance with the present technology. As shown in FIG. 2, the transistor 200 is formed on a semiconductor substrate 205 which may include a pre-defined doped well 206 to provide device regions for DDC-BC transistor and other transistor types. Transistor 200 can include a heavily doped screening region 210, which can be a single doped layer or multiple doped layers (for instance, screening layer and Vt set layer) in accordance with the various DDC transistor configurations described above. The heavily doped screening region 210 can include dopants that tend to produce an n-type region, for instance, antimony (Sb) or arsenic (As) to support a PFET transistor. Note that heavily doped region 210 can alternatively include dopants that tend to produce a p-type region, for instance, boron (B) or boron fluoride (BF$_2$), to support a NFET transistor. For such p-type dopants, these dopants can be implanted in conjunction with germanium (Ge) pre-amorphization with carbon (C) implants to help to hold the B in place and prevent unwanted out-diffusion.

In the present technology, the dopant concentrations for the heavily doped screening region 210 will be lower than in the case of non-buried channel DDC devices. For instance, heavily doped screening region 210 will preferably have a dopant concentration between about $1\times10^{18}$ atoms/cm$^3$ to $1\times10^{19}$ atoms/cm$^3$, though the actual targeted concentration and the form of the screening region (i.e., the number of layers or regions) depends on device specification. In particular embodiments, as shown in FIG. 2, the heavily doped screening region 210 extends laterally between the source 230 and drain 235 structure and can also extend across the bottom of the source 230 and drain 235 structure, unlike DDC transistor 100 of FIG. 1 where the screening region 112 extends laterally across and does not extend below the bottom of the source and drain 104, 106. The depth of the heavily doped screening region 210 below the surface of the substrate is selected to achieve the desired effects of alleviating short-channel effects for the DDC-BC transistor as well as to avoid punch-through leakage from the source 230 and drain 235.

The channel portion 215 can be formed via a blanket undoped epitaxial layer and subsequent ion implantation. An advantage of using blanket epitaxial growth is the ability to grow a uniform thickness epitaxial layer, though a result of using blanket epitaxial growth is the need for forming transistor isolation structures (not shown) subsequently, at a reduced temperature compared to conventional transistor isolation structure formation processes. Alternatively, selective epitaxial growth can be used to form channel layer 215. A reason why using selective epitaxial growth may be preferred is that selective epitaxial growth can be doped with desired dopant material to form a buried channel device, which can avoid the step of a subsequent ion implantation to form a doped buried channel region. An advantage of using an undoped epitaxial layer that is grown after the heavily doped screening region 210 is formed, is that the diffusion of dopants from the heavily doped screening region 210 material into channel portion 215 is limited.

In the various embodiments, the channel portion 215 is fabricated to be doped with dopant material that is of the same polarity as the source 230 and drain 235. Thus, for a PFET in which the source 230 and drain 235 is doped with boron or other p-type dopants, the channel portion 215 is doped with boron or other p-type dopants. However, though the effective or active concentration of dopants in the channel portion 215 can be selected to be much less than the active or effective dopant concentration of the source 230 and drain 235, by up to a few orders of magnitude or more.

Note that if channel portion 215 is initially n-type from intrinsic, then to achieve the desired active or effective boron concentration, the doping amount would be based on counter-doping to match the effective concentration of the n-type dopants, then doped to a higher amount so that the net polarity in channel portion 215 at fabrication is at the targeted effective concentration sufficient to form a desired buried channel transistor. As noted above, the terms "active dopant concentration" or "effective dopant concentration" refer to the concentration of dopants that are electrically active in the semiconductor material to provide holes or electrons.

Gate electrode 220, which can be polysilicon or metal, modulates the magnitude of current flow in channel region 215. Gate electrode 220 can be formed atop a gate oxide layer 222 to provide the gate for a metal-oxide semiconductor device. When a voltage is applied to gate electrode 220, the electric field generated causes channel region 215 to undergo a depletion of electrons or holes (depending on whether the bias is negative or positive) in the vicinity directly underneath gate oxide 222 to form a depleted layer 223 (surface depletion layer). Thus, the depletion causes a buried channel layer 225 to form in channel region 215 below depleted layer 223. A buried depletion layer 227 can also forms at the interface between screening region 210 and channel region 215, due to the different conductivity types. Due to the significantly higher doping in screening region 210, the buried depletion layer 227 is primarily located in the channel region 215. In some embodiments, as shown in FIG. 2, it is substantially formed only in the channel region 215. In the various embodiments, the final width of layers 223, 225, and 227 will vary depending on the doping concentrations and bias conditions for the device. In particular embodiments, the amount of depletion due to doping differences between the screening region 210 and the channel region 215 will be significantly less than the amount of depletion due to bias at the gate 220. This, the thickness of surface depletion layer 223 can be substantially larger than the thickness of buried depletion region 227, as shown in FIG. 2.

Figure 3A:
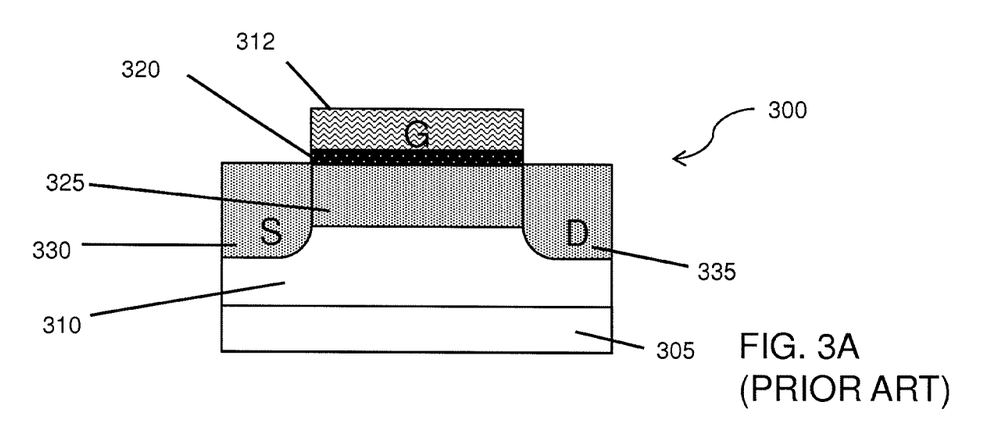
FIG. 3A is an example cross-section of a conventional buried channel transistor (non-DDC)
Figure 3B:
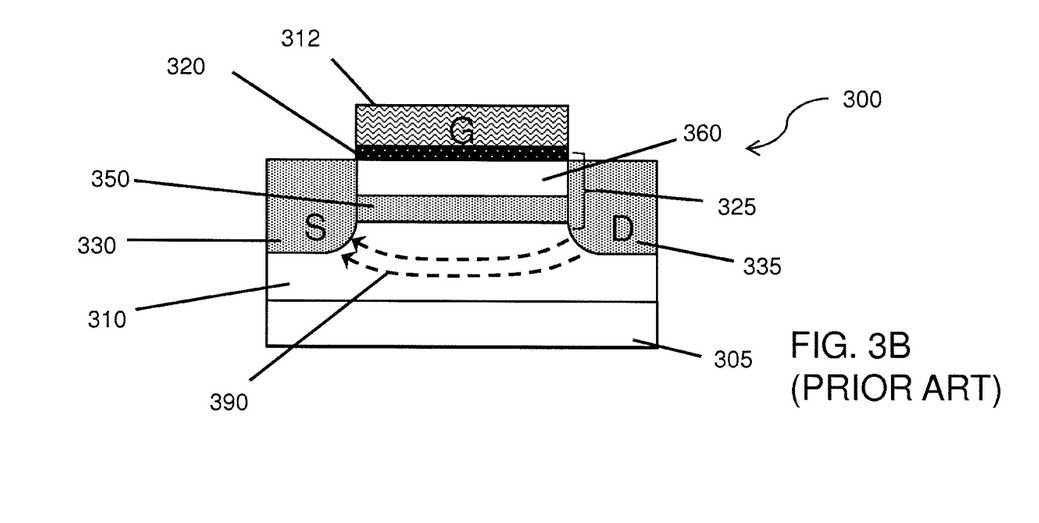
FIG. 3B is an example of the conventional transistor of FIG. 3A but illustrating the accumulation of electrically conducting species buried in the channel on application of a gate bias.

The operation of the DDC-BC transistor of the present technology can be described in the context of a conventional buried channel device, as depicted in FIGS. 3A and 3B. FIG. 3A shows a buried channel device 300 prior to biasing. There is provided a substrate 305 which is depicted in FIG. 3A as a p-type substrate. A well, in this example a p-well 310, forms the well for an NFET transistor. Gate electrode 312 is atop gate oxide 320. Source 330 and drain 335 may be doped using As or P or other material that would create an NFET. Channel 325 is doped with a material of the same polarity as source 330 and drain 335, but having a lower concentration than the concentration of dopants in the source 330 and drain 335 to enable the creation of a depletion zone or layer in channel 325.

FIG. 3B shows a buried channel device 300 under gate voltage bias. When the device is biased by applying a voltage to gate electrode 312, a buried channel layer 350 forms from the depletion of electrons or holes (depending on whether gate bias is positive or negative) from the upper portion 360 (surface depletion layer) of the channel 325 so that the buried channel layer 350, electrically coupling source 330 and drain 335, is formed. However, short-channel effects, such as punchthrough 390, can occur if the source 330 and drain 335 are too close together for the applied gate bias condition.

In the present technology, this problem of short channel effects of conventional buried transistors is alleviated by using a DDC-BC configuration. Referring back to FIG. 2, the inclusion of the heavily doped screening layer or region 210 prevents or reduces the amount of short channel effects. Thus, the punchthrough 390 observed in buried channel transistor 300 is reduced or eliminated in DDC-BC transistor 200. Thus, DDC-BC transistor 200 can support channel lengths that would cause punchthrough in buried channel transistor 300 for a same or similar gate bias conditions.

DDC-BC transistors provide improved noise and short channel performance as compared to conventional buried channel transistors. The DDC-BC transistors of the present technology can be utilized to replace conventional buried transistors in applications where improved characteristics are required or desired. For example, as noted above, a principal use for a buried channel transistor is as a source follower in an image sensor circuit. However, as noted below, conventional buried channel transistors are not ideal for this application. In contrast, the DDC-BC transistors of the present technology can be utilized to provide image sensor circuits without the deficiencies of image sensor circuits with conventional buried channel transistors.

A basic source follower circuit typically includes a MOS transistor, with its drain biased at a fixed voltage, and a current load, which is generally supplied externally. Source followers are used in the image sensor as a voltage level shifter. Source follower operation is usually based on a single MOS transistor, which may be a four-terminal device. The gate-to-source voltage is the primary determinate of the conductivity between the drain and source, provided short channel effects in the transistor are adequately contained. In a basic source follower configuration with a constant current load, a drain voltage, a source voltage, and an established gate bias, the gate and source voltages track each other to maintain a constant current. As the gate voltage changes, the source voltage must change accordingly in the same direction. If the gate is considered as an input and the source as an output of an electrical network, the source follows the action of the gate.

Figure 4:
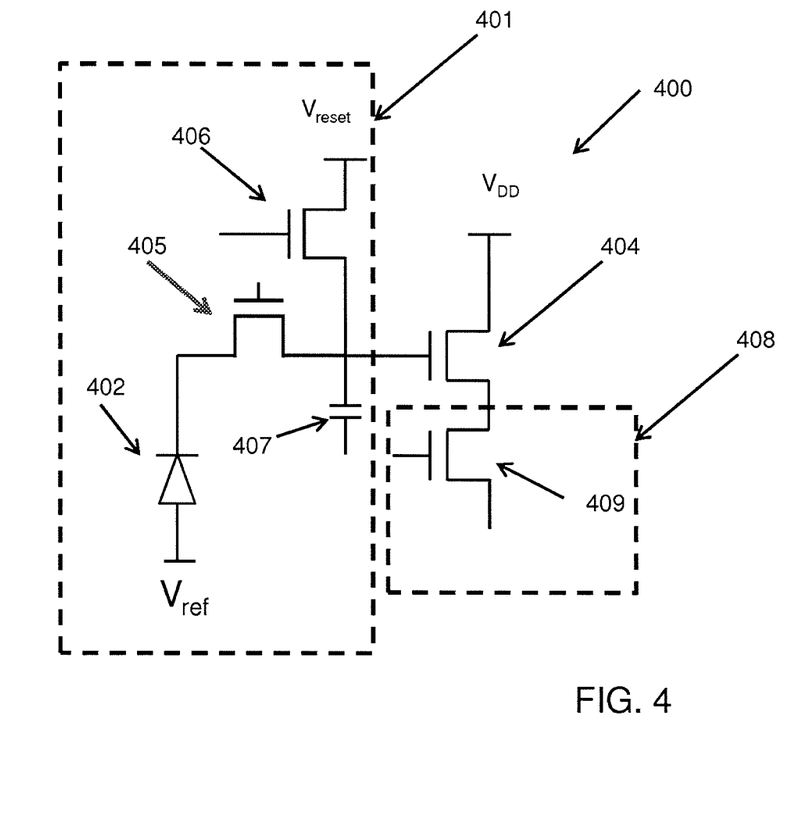
FIG. 4 is an example of a simple image sensor circuit using a source follower device in accordance with the present technology.

An image sensor circuit 400, incorporating a DDC-BC transistor in accordance with the present technology, is schematically illustrated in FIG. 4. The circuit 400 includes a gate control circuit 401 coupled to the gate of a DDC-BC source follower transistor 404. The gate control circuit can include a photodiode 402 to convert collected photons into an electrical signal and a transfer gate 405 to relay the electrical signals to the DDC-BC source follower 404. The gate control circuit 401 can also include a pass or reset transistor 406 and a capacitor 407. In the various embodiments, the gate control circuit 401 can also include additional components to provide an appropriate signal at the gate of DDC-BC source follower 404.

The circuit 400 can further include an output circuit 408 coupled to a source of the DDC-BC source follower 404. The output circuit 408 can also include a pass or transfer gate 409, as well as other components for selecting the image circuit 400 and collecting data based on the output of the photodiode 402. In the various embodiments, the transistors 405, 406, and 409 can be conventional transistors or DDC transistors.

In operation, millions of individual instances of circuit 400 can be provided and arranged in an array to detect an image. The circuit 400 (and other similar circuits in the image sensor array) then transfer an electrical signal proportionally matched to light intensity incident on photodiode 402 for further amplification and processing, eventually resulting in a digital image.

Now that some exemplary embodiments of the DDC-BC transistors of the present technology have been described, the present disclosure turns to a description of the methods for fabricating such devices.

Figure 5:
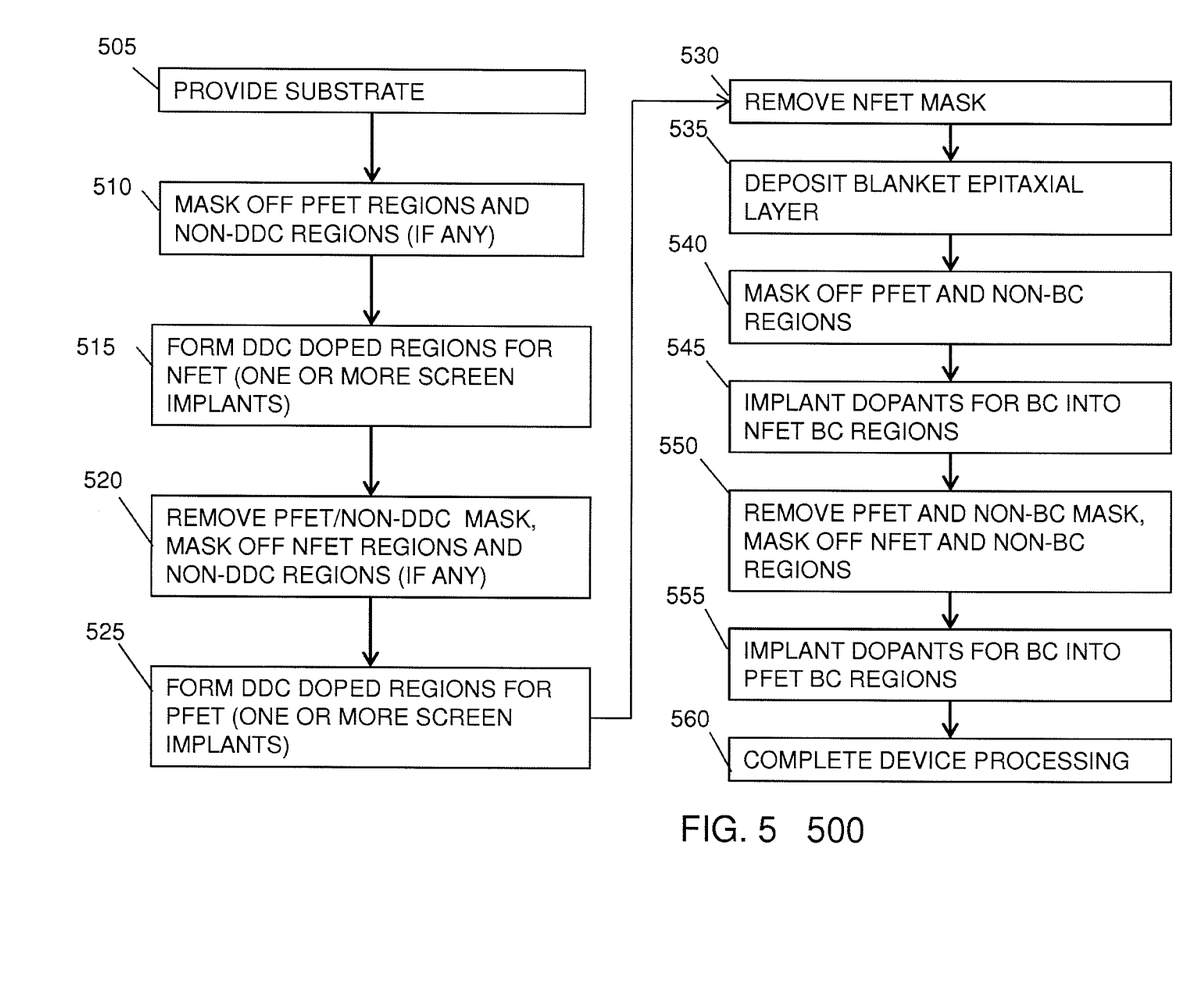
FIG. 5 is one example of an integrated process flow in accordance with the present technology for fabricating NFET and PFET buried channel DDC transistors using a blanket epitaxial deposition as a process step.

FIG. 5 provides a process flow of steps in a first exemplary method 500 for fabricating DDC-BC transistors. The process flow contemplates that there may be PFET and NFET DDC-BC transistors and that DDC-BC transistors may be fabricated along with DDC devices as well as non-DDC regions on a same semiconductor substrate.

Method 500 begins at step 505 where there is provided a substrate. As noted above, the substrate can include one or more well regions to define device regions. Additionally, the substrate may already include isolation regions between the device regions. At 510, a mask is used to mask off and protect portions to be fabricated later. In particular, the masking at step 510 is configured to mask off PFET regions and any non-DDC NFET regions in contemplation of forming DDC NFET regions. However, it should be noted that the present disclosure contemplates that the order of which device types to fabricate first, PFET or NFET, can be switched in the various embodiments. To provide the masking at step 510, any kind of mask material may be used, including one or more hard mask layers, one or more photoresist layers, or any combination thereof. The masking at step 510 also involves patterning of the mask using photolithography according to a pre-defined mask pattern.

At step 515, DDC doped regions are formed for NFET, using any of the screen combinations described above. Separate doping of a Vt layer can also also be performed. In one particular embodiment, DDC doped regions are formed using ion implantation with selected implant conditions (e.g., species, energy, and dose) to result in a desired effective dopant concentration, after activation of the dopants, with the dopant peak(s) targeted to be located a particular distance from the to-be-formed top surface of the substrate.

At step 520, the mask of step 510 is removed, and another mask is placed to mask off NFET regions as well as non-DDC PFET regions (if any). At step 525, the DDC doped regions are then formed for PFET, using any of the screen combinations described. These steps can be performed in a substantially similar manner as steps 510 and 515.

At step 530, the mask of step 520 is removed. Thereafter, at step 535, a blanket epitaxial layer can be deposited across the substrate. The thickness of the blanket epitaxial layer can be selected according to the device characteristics required for the DDC transistor (buried or otherwise). Exemplary final film thickness for the epitaxial layer may be in the range of 10 nm to 100 nm. During step 535, appropriate steps can be taken in advance of the epitaxial layer deposition to ensure a clean formation of crystalline semiconductor material (preferably, intrinsic silicon) on the substrate to minimize defects. The epitaxial layer is grown as uniformly as possible, to a thickness preselected so that, taking into account expected film loss as the substrate continues its fabrication processes, the final thickness of the epitaxial layer meets specifications.

It should be noted that the epitaxial layer provided at step 535 can be deposited as a blanket film over the substrate or deposited selectively. The type of layer can be selected based on the deposition method. Additionally, while the blanket epitaxial layer is primarily described as being deposited as a substantially undoped layer, the various embodiments are not limited in this regard. In some embodiments, in-situ doping can be provided in this layer to avoid or limit the amount of subsequent implantation required at steps 545 or 555.

At step 540, the PFET and non-buried channel DDC transistor regions are masked off to prevent processing of those regions. Thereafter, at step 545, dopants of the same polarity as the to-be-formed NFET device type are implanted into the channel region, defined by the blanket epitaxial layer, to provide the buried channel DDC transistor device regions. Doping conditions are selected to result in an effective dopant concentration for the channel that is in-line with specification, which may generally be a concentration that is one to two orders of magnitude lower than the concentration of the doped source and drain region.

At step 550, the mask of step 540 mask is removed, and the NFET and non-buried channel DDC transistor regions are covered over with another mask. Note that although the process is described in terms of masking off PFET first, the order of which device types to be processed first can be switched. At step 555, dopants of the same polarity as the to-be-formed PFET device type are then implanted into the channel region for the buried channel DDC transistor devices. Doping conditions are selected to result in an effective dopant concentration for the channel that is in-line with specification, which may generally be a concentration that is one to two orders of magnitude lower than the concentration for the doped source and drain region. The process described contemplates that appropriate anneals would be performed to remove damage and recrystallize the epitaxial layer as needed, but the thermal budget would be set so as to avoid unnecessary or undesired diffusion and migration of dopants in the channel and to otherwise maintain desired concentrations of dopant materials in the screening region and channel including for those non-buried channel DDC devices where the channel is preferably maintained as intrinsic (having an effective or active dopant concentration of less than $5 \times 10^{17}$ atoms/cm$^3$).

After step 555, any additional processing required to complete the devices can be performed at step 560. This can include formation of source regions and drain regions, formation of gate structures, additional implants required, and metallization. These additional steps can be performed together or separately for different device types, as needed.

Figure 6:
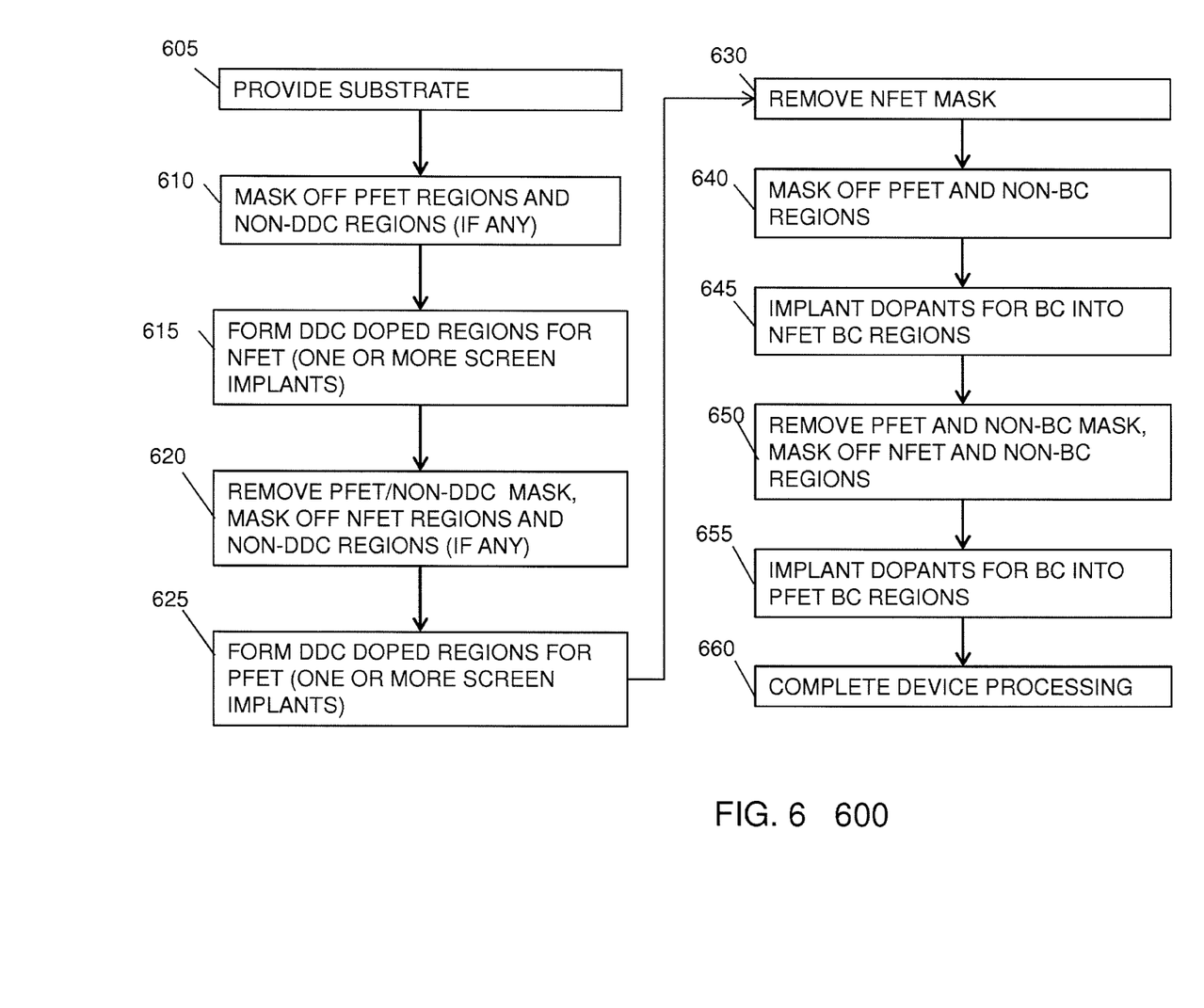
FIG. 6 is one example of an integrated process flow in accordance with the present technology for fabricating NFET and PFET buried channel DDC transistors without using a blanket epitaxial deposition as a process step.

FIG. 6 provides a process flow of steps in a second exemplary method 600 for fabricating DDC-BC transistors. As in the case of FIG. 5 above, the method 600 at FIG. 6 contemplates that there may be PFET and NFET DDC-BC transistors and DDC-BC transistors may be fabricated along with DDC devices as well as non-DDC regions on a same semiconductor substrate.

Method 600 begins at step 605 where there is provided a substrate. As noted above, the substrate can include one or more well regions to define device regions. Additionally, the substrate may already include isolation regions between the device regions. At 610, a mask is used to mask off and protect portions to be fabricated later. In particular, the masking at step 610 is configured to mask off PFET regions and any non-DDC NFET regions in contemplation of forming DDC NFET regions. However, if should be noted that the present disclosure contemplates that the order of which device types to fabricate first, PFET or NFET, can be switched in the various embodiments. To provide the masking at step 610, any kind of mask material may be used, including one or more hard mask layers, one or more photoresist layers, or any combination thereof. The masking at step 610 also involves patterning of the mask using photolithography according to a pre-defined mask pattern.

At step 615, DDC doped regions are formed for NFET, using any of the screen combinations described above. Separate doping of Vt layer can also be performed. In one particular embodiment, DDC doped regions are formed using ion implantation with a selected implant conditions (e.g., species, energy, and dose) to result in a desired effective dopant concentration, after activation of the dopants, with the dopant peak(s) targeted to be located a particular distance from the to-be-formed top surface of the substrate.

At step 620, the mask of step 610 is removed, and another mask is placed to mask off NFET regions as well as non-DDC PFET regions (if any). At step 625, the DDC doped regions are then formed for PFET, using any of the screen combinations described. These steps can be performed in a substantially similar manner as steps 610 and 615. At step 630, the mask of step 620 is removed.

In method 600, rather than providing a blanket epitaxial film, as in method 500, the implants for the screening regions are performed such that the peak of the distribution is below the surface of the substrate. Thus, this provides the heavily doped screening region and a low doped or undoped channel region above the screening region. To provide such a configuration, the implants at steps 615 and 625 can be selected to be different than those of steps 515 and 525 of FIG. 5. For example, whereas implant conditions at step 515 in method 500 in FIG. 5 can be set at energies of approximately 3 keV to 15 keV (depending on the dopant species), the implant energies for step 615 may be set at energies of approximately an order of magnitude higher. At this step, separate doping of Vt layer can also be performed, or dual screen schemes can be implemented. Similarly, at step 625, appropriate implant energies would be approximately an order of magnitude higher than the implant energy that would be used at step 525 in method 500 in FIG. 5.

At step 640, the PFET and non-buried channel DDC transistor regions are masked off to prevent processing of those regions. Thereafter, at step 645, dopants of the same polarity as the to-be-formed NFET device type are implanted into the channel region to provide the buried channel DDC transistor device regions. Doping conditions are selected to result in an effective dopant concentration for the channel that is in-line with specification, which may generally be a concentration that is one to two orders of magnitude lower than the concentration of the doped source and drain region. The doping can be selected to provide any counter-doping from previous implants.

At step 650, the mask of step 640 mask is removed, and the NFET and non-buried channel DDC transistor regions are covered over with another mask. Note that although the process is described in terms of masking off PFET first, the order of which device types to be processed first can be switched. At step 655, dopants of the same polarity as the to-be-formed PFET device type are then implanted into the channel region for the buried channel DDC transistor devices. Doping conditions are selected to result in an effective dopant concentration for the channel that is in-line with specification, which may generally be a concentration that is one to two orders of magnitude lower than the concentration for the doped source and drain region. The doping can be selected to provide any counter-doping from previous implants.

The process described above contemplates that appropriate anneals would be performed to remove damage and recrystallize the epitaxial layer as needed, but the thermal budget would be set so as to avoid unnecessary or undesired diffusion and migration of dopants in the channel and to otherwise maintain desired concentrations of dopant materials in the screening region and channel including for those non-buried channel DDC devices where the channel is preferably maintained as intrinsic (having an effective or active dopant concentration of less than $5 \times 10^{17}$ atoms/cm$^3$).

After step 655, any additional processing required to complete the devices can be performed at step 660. This can include formation of source regions and drain regions, formation of gate structures, additional implants required, and metallization. These additional steps can be performed together or separately for different device types, as needed.

While various embodiments of the present technology have been described above, it should be understood that they have been presented by way of example only, and not limitation. Numerous changes to the disclosed embodiments can be made in accordance with the disclosure herein without departing from the spirit or scope of the technology. Thus, the breadth and scope of the present technology should not be limited by any of the above described embodiments. Rather, the scope of the technology should be defined in accordance with the following claims and their equivalents.

Although the technology has been illustrated and described with respect to one or more implementations, equivalent alterations and modifications will occur to others skilled in the art upon the reading and understanding of this specification and the annexed drawings. In addition, while a particular feature of the technology may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the technology. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this technology belongs. Also, the terms "about", "substantially", and "approximately", as used herein with respect to a stated value or a property, are intended to indicate being within 20% of the stated value or property, unless otherwise specified above. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A semiconductor device, comprising:
a semiconductor substrate having at least one device region of a first conductivity type;
a source region and a drain region of a second conductivity type formed in the at least one device region and separated by a channel length;
a channel region of the second conductivity type formed in the at least one device region between the source region and the drain region; and
a screening region of the first conductivity type formed in the at least one device region below the channel region and between the source region and the drain region, an effective doping density of the screening region being substantially higher than an effective doping density of the at least one device region; and
a gate structure formed on the at least one device region above the channel region,
wherein the channel region is modified, in response to a bias voltage at the gate structure, to provide a surface depletion layer below the gate structure, a buried depletion layer at an interface of the channel region and the screening region, and a buried channel layer between the surface depletion layer and the buried depletion layer electrically coupling the source region and the drain region, and
wherein the buried depletion layer is substantially located in channel region.

2. The semiconductor of claim 1 wherein the channel region has an effective doping density of the second conductivity type less than an effective doping density of the second conductivity type for the source region and the drain region and less than an effective doping density of the first conductivity type for the screening region.

3. The semiconductor device of claim 1, wherein the channel region has an effective doping density that is less than $\frac{1}{10}$ of an effective doping density of the source region and the drain region.

4. The semiconductor of claim 1, wherein the screening region has an effective doping density of between about $10^{18}$ cm$^{-3}$ to $5\times10^{20}$ cm$^{-3}$.

5. The semiconductor device of claim 1, wherein the buried depletion layer is completely located in the channel region.

6. The semiconductor device of claim 1, further comprising:
a gate control circuit, the gate control circuit comprising a reset transistor and a photodiode electrically coupled in series between a first reference voltage node and a second reference voltage node; and
an output circuit electrically coupled to the source region, wherein the drain region is electrically coupled to a power supply node, and wherein the gate structure is electrically coupled to a portion of the gate control circuit between the reset transistor and the photodiode to define a gate control node.

7. The semiconductor device of claim 6, wherein the gate control circuit further comprises a transfer gate electrically coupled in series between the gate control node and the photodiode, and wherein the output circuit comprises a pass transistor.

* * * * *